(12) United States Patent
Chen et al.

(10) Patent No.: US 7,253,114 B2
(45) Date of Patent: Aug. 7, 2007

(54) SELF-ALIGNED METHOD FOR DEFINING A SEMICONDUCTOR GATE OXIDE IN HIGH VOLTAGE DEVICE AREA

(75) Inventors: Chien-Mao Chen, Kaohsiung (TW); Jun Xiu Liu, Taichung (TW); Cuker Huang, Banciao (TW); Chi-Hsuen Chang, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 112 days.

(21) Appl. No.: 11/082,514

(22) Filed: Mar. 16, 2005

(65) Prior Publication Data
US 2006/0211190 A1 Sep. 21, 2006

(51) Int. Cl.
*H01L 21/302* (2006.01)

(52) U.S. Cl. ............ 438/704; 438/587; 438/694; 438/706; 438/734; 438/745; 438/756; 438/778; 438/942; 438/241; 438/258; 438/275

(58) Field of Classification Search ............ 438/587, 438/694, 704, 706, 734, 745, 756, 761, 778, 438/787, 791, 942, FOR. 388, FOR. 395, 438/FOR. 401
See application file for complete search history.

(56) References Cited

U.S. PATENT DOCUMENTS

| | | | |
|---|---|---|---|
| 5,827,784 A * | 10/1998 | Loos | 438/750 |
| 6,281,050 B1 * | 8/2001 | Sakagami | 438/142 |
| 2004/0026750 A1 * | 2/2004 | Takamura | 257/391 |
| 2004/0266111 A1 * | 12/2004 | Lee | 438/264 |

* cited by examiner

*Primary Examiner*—George Fourson
*Assistant Examiner*—Joannie Adelle Garcia
(74) *Attorney, Agent, or Firm*—Duane Morris LLP

(57) ABSTRACT

A method is provided for forming at least three devices with different gate oxide thicknesses and different associated operating voltages, in the same integrated circuit device. The method includes forming a plurality of gate oxides with different thicknesses in high voltage and low voltage areas in the same integrated circuit device. A dry etching operation is used to remove the relatively thick gate oxide from the high voltage area using photoresist masking of the low voltage area and a hard mask in the high voltage area, to mask the gate oxide films. A wet etching procedure is then used to remove the gate oxide film from the low voltage areas. The hard mask may be formed over a polysilicon structure.

20 Claims, 5 Drawing Sheets

SELF-ALIGNED METHOD FOR DEFINING A SEMICONDUCTOR GATE OXIDE IN HIGH VOLTAGE DEVICE AREA

FIELD OF THE INVENTION

The present invention relates, most generally, to semiconductor devices and methods for forming the same. More particularly, the present invention is directed to methods and structures for providing a semiconductor device with both high voltage and low voltage areas on the same substrate. Multiple devices having multiple gate oxide thicknesses and associated operating voltages are provided and high gate oxide integrity is maintained.

BACKGROUND

Integrated circuit driver devices typically include high voltage and low voltage regions and use at least three operating voltages. The different operating voltages are used for different device types formed on the substrate and the different operating voltages are associated with gate oxides thicknesses that differ according to the operating voltage. Devices formed in low voltage areas may include gate oxide thicknesses approximately 150 angstroms or less whereas in the high voltage areas formed on the same substrate, devices that operate at high voltages (greater than 15 volts) typically require gate oxide thicknesses above 300 angstroms.

A challenge in semiconductor manufacturing technology is to form multiple gate oxides of various thicknesses on the same substrate, then to define and form associated devices using the various gate oxides without attacking gate oxide integrity of the various thickness gate oxides. Wet etching procedures (also referred to as wet dips or strips) are typically used to remove gate oxide from areas that are not masked by a transistor gate or other device. Multiple wet etching procedures directed to removing the multiple gate oxides, or wet etching procedures directed to removing the thickest gate oxide, may result in gate oxide penetration and/or undercut. This leads to GOI (gate oxide integrity) failures and inoperative devices.

It would therefore be desirable to provide semiconductor integrated circuit devices such as driver devices that utilize multiple operating voltages and therefore include multiple gate oxide thicknesses, on the same substrate, using a processes that form devices with various gate oxides, without attacking or compromising the gate oxides.

SUMMARY OF THE INVENTION

To address these and other needs and in view of its purposes, the present invention provides a method for forming a semiconductor device.

The method includes providing a substrate with a designated high voltage (HV) and low voltage areas. A plurality of gate oxides are formed including a thick gate oxide in the HV area and at least one thin gate oxide in the LV area, the thick gate oxide being thicker than the thin gate oxides in the LV area. The method then provides for forming a pattern of poly features in each of the high voltage and low voltage areas, the poly features including polysilicon covered by an etch resistant material. A photoresist pattern is then formed over at least the LV area, then plasma etching is used to remove the thick gate oxide from portions of the HV area that are not masked by one of the poly features. The method then provides for removing the photoresist pattern and wet etching to remove the at least one thin gate oxide from the LV area that is not masked by one of the poly features. During the wet etching, the etch resistant material of the poly features acts as a hardmask and prevents damage to the relatively thick gate oxide in the HV area.

In another aspect, the invention provides a method for forming a semiconductor device comprising providing a substrate with designated high voltage (HV) and low voltage (LV) areas, forming a plurality of gate oxides including at least one thick gate oxide in the HV area and at least one thin gate oxide in the LV area, each thick gate oxide being thicker than each thin gate oxide. The method further provides forming a pattern of poly features in each of the high voltage and low voltage areas, the poly features including polysilicon covered by a hardmask, plasma etching to remove the at least one thick gate oxide from the HV area that is not masked by a hardmask, and wet etching to remove the at least one thin gate oxide from the LV area not masked by one of the poly features.

In another aspect, the invention provides a method for forming a semiconductor device comprising providing a substrate with designated high voltage (HV) and low voltage (LV) areas, forming a plurality of gate oxides including at least one thick gate oxide in said HV area and at least one thin gate oxide in said LV area, each thick gate oxide being thicker than each thin gate oxide. The method further provides forming masking patterns over the plurality of gate oxides, the masking patterns including patterned photoresist sections and poly features including polysilicon covered by a hardmask. Plasma etching using a selective oxide etch that removes portions of the plurality of gate oxides not covered by masking patterns, is then used. The patterned photoresist sections are then removed and wet etching is used to remove portions of the at least one thin gate oxide from not masked by one of the poly features.

BRIEF DESCRIPTION OF THE DRAWING

The present invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
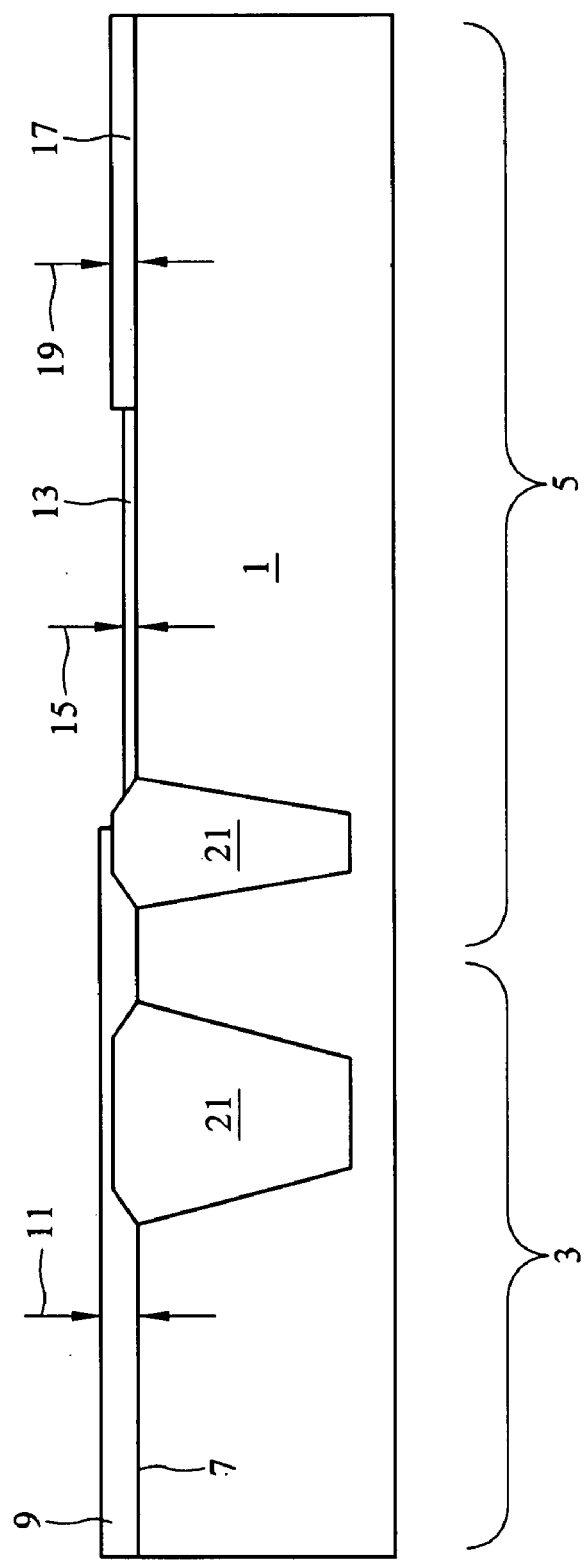
FIGS. 1-6 are cross-sectional views showing a sequence of processing operations that for devices of gate oxide thicknesses according to an embodiment of the invention.

FIG. 1 is a cross-sectional view showing a substrate 1 with designated high voltage (HV) areas 3 and low voltage (LV) areas 5. High voltage areas 3 and low voltage areas 5 are predesignated regions that will accommodate the formation of high voltage and low voltage devices, respectively. Substrate 1 may be a semiconductor substrate such as a silicon wafer, but other substrates such as gallium arsenide or other suitable materials may be used. In the illustrated embodiment of FIG. 1, three gate oxide thicknesses are illustrated. Each of the gate oxides are formed on top surface 7 of substrate 1. Each of the gate oxides may be formed using conventional methods such as thermal oxidation after patterning with an oxide-resistant film such as silicon nitride. In high voltage area 3, first gate oxide 9 has a thickness 11 which may be greater than 300 angstroms in one exemplary embodiment, but other thicknesses may be used in other exemplary embodiments. The gate oxide film or films in high voltage area 3 are understood to be each thicker than the gate oxide films in low voltage area 5. Low voltage area 5 includes second gate oxide film 13 having a thickness 15 that may be less than 40 angstroms in one exemplary embodiment, but other thicknesses may be used in other exemplary embodiments. Third gate oxide 17 in low voltage area 5 includes thickness 19 which may lie within the range of 50-200 angstroms and most advantageously within the range of 100-120 angstroms in various exemplary embodiments. Thickness 19 may be 110 angstroms and one embodiment, but other thicknesses may be used alternatively. In the invention, either or both of high voltage (HV) areas 3 and low voltage (LV) areas 5 may include multiple different thicknesses of oxides that will be used as gate oxides for various devices that will operate at different operating voltages. Shallow trench isolation (STI) structures 21 may be formed in various locations extending into substrate 1 from top surface 7.

Figure 2:
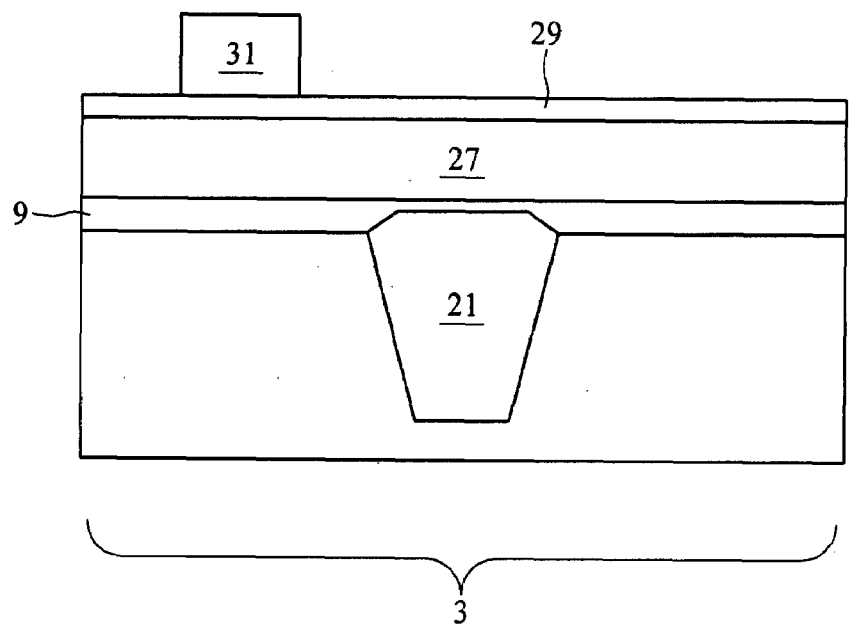

A polysilicon film is formed over the structure of FIG. 1 and an etch resistant film which may serve as a hard mask and/or an anti-reflective coating (ARC) formed over the poly silicon. FIG. 2 shows polysilicon film 27 and etch resistant film 29 formed over polysilicon film 27. In an exemplary embodiment, etch resistant film 29 may be a silicon oxynitride (SiON) having a thickness of about 320 angstroms, but other etch resistant materials may be used alternatively. In an exemplary embodiment, polysilicon film 27 may have a thickness within the range of 1700-2200 angstroms and may be undoped, but doped films of different thicknesses may also be used in other embodiments. Polysilicon film 27 and etch resistant film 29 are formed over the entire semiconductor substrate 1, not just over the portion of high voltage area 3 as illustrated in FIG. 2. A pattern of photoresist material 31 is formed to act as a mask for a subsequent etching processes.

Figure 3:
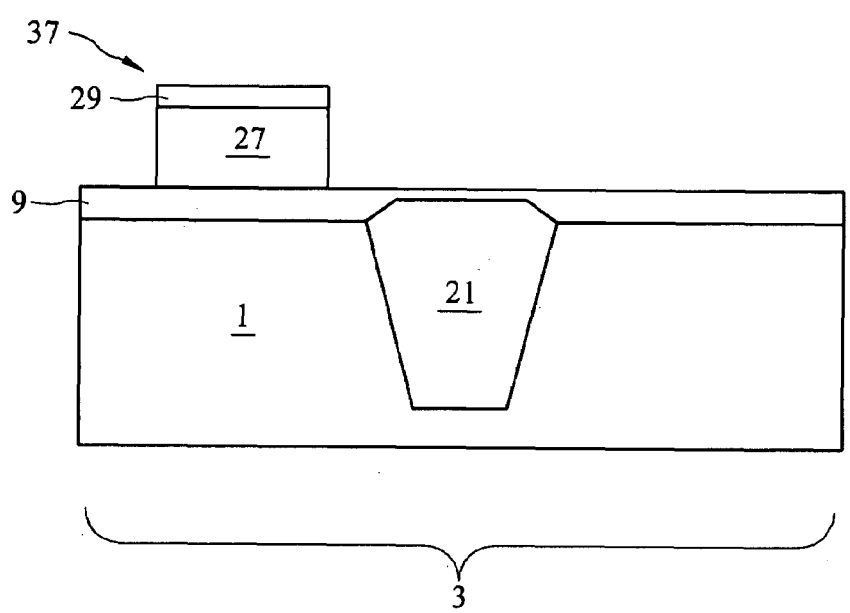

FIG. 3 shows the structure of FIG. 2 after an anisotropic plasma (dry) etching operation has been carried out to successively etch etch resistant film 29, and polysilicon film 27 to form poly feature 37, composed of polysilicon film 27 and etch resistant film 29. With the photomask (photoresist material 31) in place, conventional selective etching procedures may be used to etch unmasked portions of etch resistant material 29 and polysilicon film 27 and to form poly features 37. In an exemplary embodiment, poly feature 37 may ultimately serve as a gate for a transistor device. Photoresist material 31 is then removed. Although not shown in FIGS. 2 and 3, similar poly features 37 are simultaneously formed in low voltage area 5 as will be shown in FIG. 4.

Figure 4:
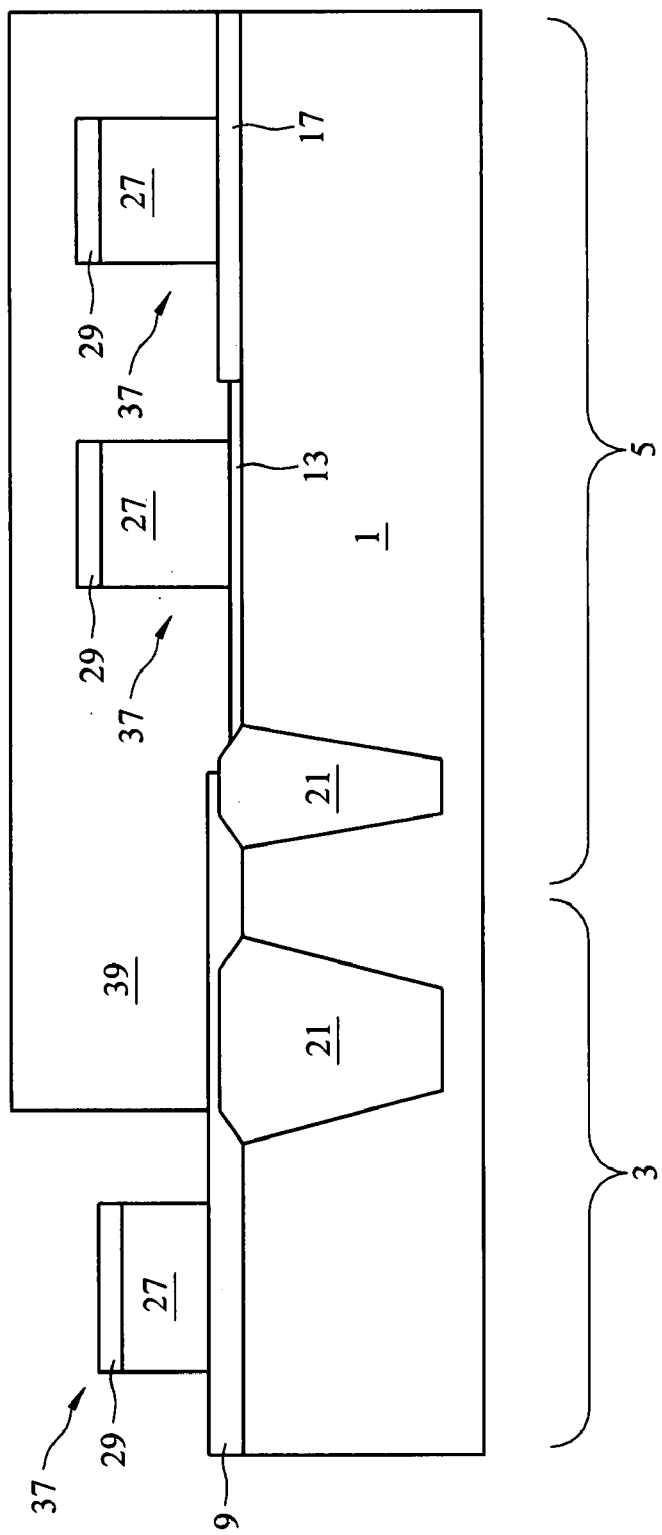

Masking film 39 is formed as shown in FIG. 4. Masking film 39 may be photoresist and is preferentially formed over low voltage area 5. With masking film 39 in place and protecting the gate oxide material in low voltage area 5, and poly feature 37 masking first gate oxide 9 of high voltage area 3, a plasma etching operation is carried out to remove unmasked sections of first gate oxide 9. In an exemplary embodiment, the etching operation may include a pressure of about 40 millitor, an upper power of about 1400-1600 watts, a bottom power of about 1700-1900 watts, and may use $CHF_3$, $O_2$ and CO as etch gases. Bottom power refers to the power applied to the electrode upon which the substrate rests and upper power refers to the power applied to the electrode disposed above the substrate. In one exemplary embodiment, the $CHF_3$ flow may be 150 sccm, $O_2$ may be 180 sccm and the CO flow may be about 70 sccm but other flow rates and other relative flow rates may be used in other exemplary embodiments. The plasma etching operation is an anisotropic etching process that selectively removes oxides and forms the structure shown in FIG. 5 after masking material 39 is removed.

Figure 5:
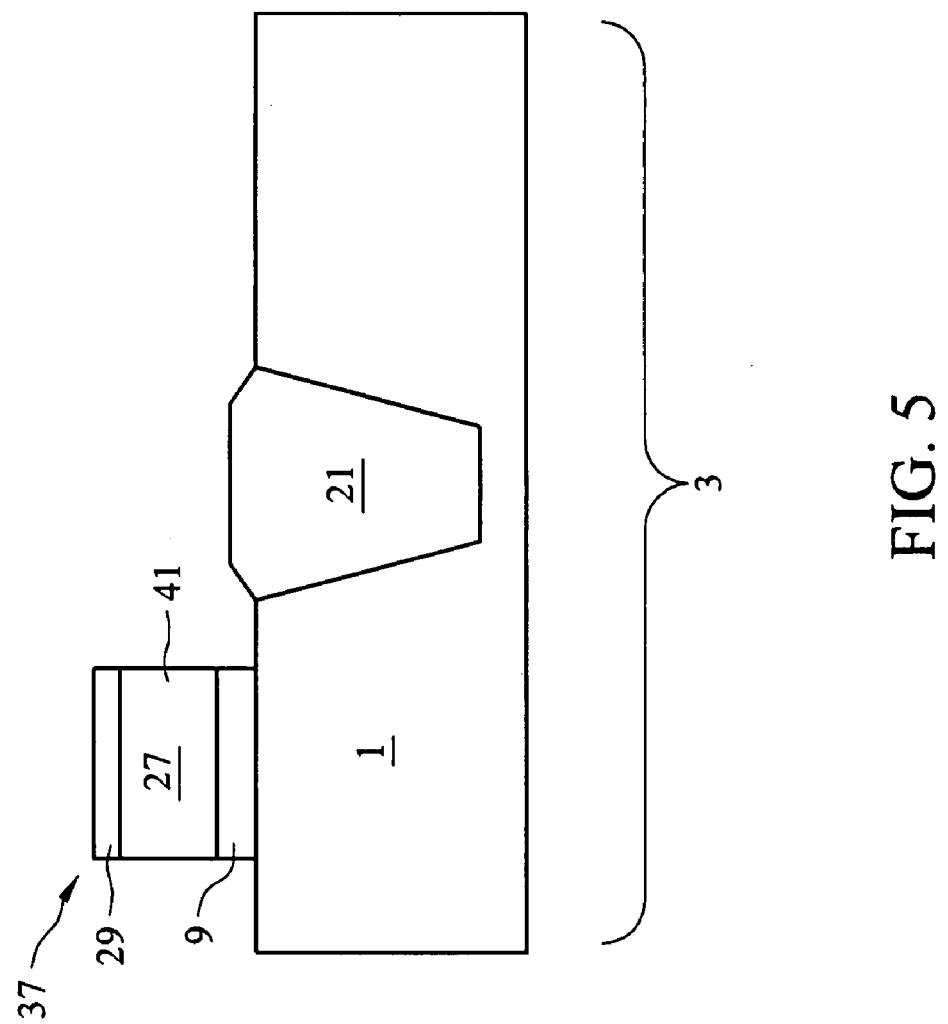

The structure of FIG. 5 includes first device 41 consisting of poly feature 37 and gate oxide 9 in high voltage area 3. A wet etching operation is used to remove remaining gate oxide films in areas not masked by a poly features 37 which are formed in various areas on the substrate. In an exemplary embodiment, a photoresist film may be formed and patterned to mask the already-etched high voltage areas 3 This additional photoresist layer is an optional feature. The wet etching operation may advantageously be a hydrofluoric (HF) acid dip that removes all exposed oxides. Since the gate oxides being removed from low voltage area 5 are thinner than the gate oxides such as first gate oxide 9 of high voltage area 3, the dipping time is minimized and the first gate oxide film 9 in the high voltage area 3 is not appreciably attacked. After the wet etching operation, the structure shown in FIG. 6 is produced.

Figure 6:
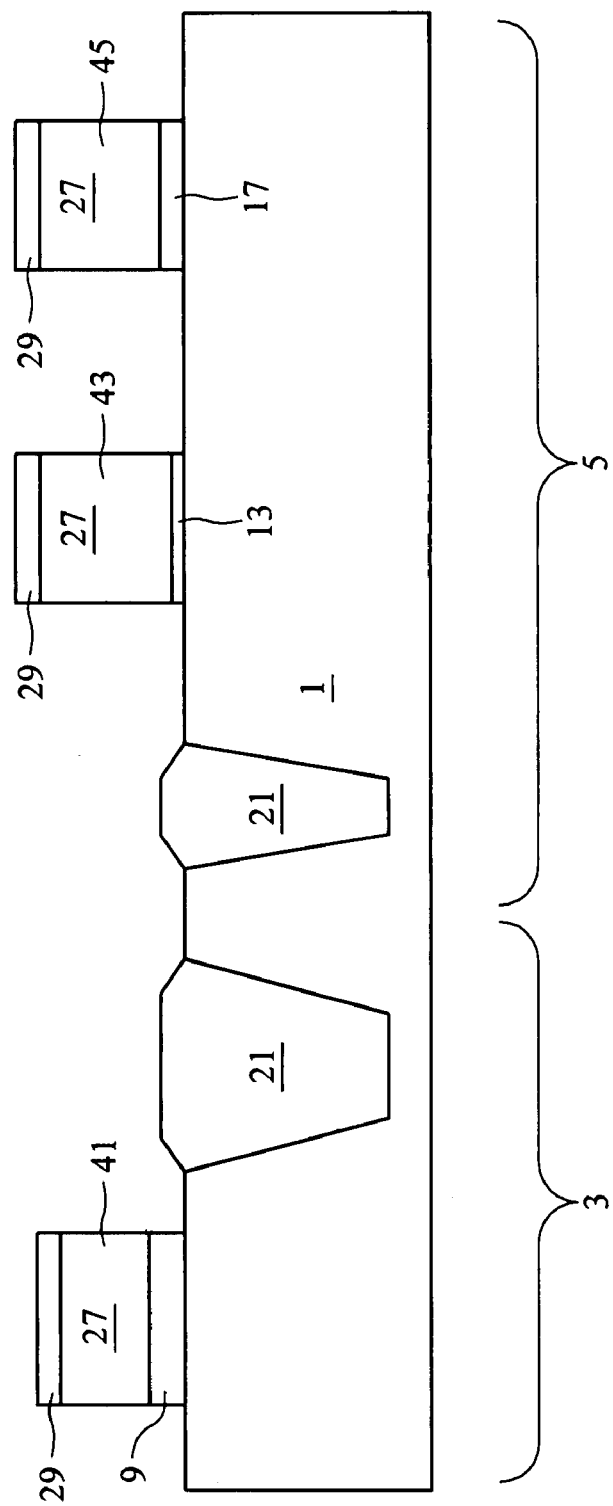

FIG. 6 illustrates high voltage area 3 and low voltage area 5 of substrate 1 and includes first device 41 formed of a poly feature 37 and first gate oxide 9, second device 43 formed of poly feature 37 and second gate oxide 13, and third device 45 formed in low voltage area 5 and including poly feature 37 and third gate oxide 17. As noted earlier, gate oxide 9 includes a greater thickness than each of the thinner, low voltage area 5 gate oxides 13 and 17 in an exemplary embodiment. In an exemplary embodiment, each of devices 41, 43 and 45 may be transistors with polysilicon film 27 forming a gate electrode. Subsequent processing operations may be carried out to form the other features associated with devices 41, 43 and 45 such as source/drain regions and channels with appropriate doping characteristics. Appropriate interconnect features may be added to wire the devices and form a driver integrated circuit or other device on a substrate and which operates using multiple operating voltages. FIG. 6 may represent, in an exemplary embodiment formed on one substrate, first device 41 having first gate oxide 9 having a thickness greater than 300 angstroms and operating at a voltage greater than 30 volts in HV area 3, second device 43 formed in low voltage area 5 and including a thickness of gate oxide 13 being less than 40 angstroms and operating at an operating voltage within the range of about 1.8-2.5 volts, and third device 45 that includes gate oxide 17 having a thickness in the range of 100-120 angstroms and operating at a voltage of about 5 volts. In other exemplary embodiments, other combinations of devices using different operating voltages and having associated different gate oxide thicknesses, may be formed within an integrated circuit driver device or other device on the same substrate. For example, first device 41 may operate at a voltage greater than 20 volts in HV area 3 in another exemplary embodiment.

Although illustrated in conjunction with an exemplary IC driver device that includes two devices with associated gate oxide thicknesses and operating voltages in the low voltage area 5 and one device in high voltage area 3, it is an aspect of this invention that various pluralities of such devices with different gate oxide thicknesses and associated operating voltages, may be used. For example, high voltage 3 may include multiple devices with different gate oxide thicknesses and associated operating voltages.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a semiconductor device comprising:
   providing a substrate with designated high voltage (HV) and low voltage (LV) areas;
   forming a plurality of gate oxides including a thick gate oxide in said HV area and at least one thin gate oxide in said LV area, said thick gate oxide being thicker than said at least one thin gate oxide;
   forming a pattern of poly features in each of said high voltage and low voltage areas, said poly features including polysilicon covered by an etch resistant material;
   forming a photoresist pattern at least over said LV area;
   plasma etching to remove said thick gate oxide from said HV area that is not masked by one of said poly features;
   removing said photoresist pattern; and
   wet etching to remove said at least one thin gate oxide from said LV area not masked by one of said poly features.

2. The method as in claim 1, wherein said etch resistant material comprises silicon oxynitride.

3. The method as in claim 1, wherein each of said plurality of gate oxides is formed by thermally oxidizing after patterning with a silicon nitride film.

4. The method as in claim 1, further comprising, prior to said wet etching, forming a further photoresist pattern over said HV area.

5. The method as in claim 1, wherein said wet etching comprises exposing said substrate to a hydrofluoric acid solution.

6. The method as in claim 1, further comprising forming a high voltage transistor using one of said poly features and said thick gate oxide, forming a low voltage transistor using one of said poly features and said thin gate oxide, operating said high voltage transistor at a voltage greater than 20 volts and operating said low voltage transistor at a voltage within a range of 1.5-5 volts.

7. The method as in claim 6, wherein said first thin gate oxide includes a thickness less than 150 angstroms, and said thick gate oxide includes a thickness greater than 300 angstroms.

8. The method as in claim 1, wherein said at least one thin gate oxide comprises a first thin gate oxide and a second thin gate oxide, said forming a pattern of poly features includes forming said poly features over said first thin gate oxide and over said second thin gate oxide; and
   said wet etching removes said first thin gate oxide and said second thin gate oxide in areas not masked by one of said poly features.

9. The method as in claim 8, wherein said first thin gate oxide includes a thickness less than 40 angstroms, said second thin gate oxide includes a thickness within a range of 100-200 angstroms and said thick gate oxide includes a thickness greater than 300 angstroms.

10. The method as in claim 8, further comprising forming a first transistor using one of said poly features and said first thin gate oxide, forming a second transistor using one of said poly features and said second thin gate oxide, and forming a third transistor using one of said poly features and said thick gate oxide and
    operating said first transistor at an operating voltage of 1.8-2.5 volts, operating said second transistor at an operating voltage of about 4-6 volts, and operating said third transistor at an operating voltage greater than 30 volts.

11. The method as in claim 8, further comprising forming a protective material over said HV area prior to said wet etching.

12. The method as in claim 1, wherein said plasma etching includes a pressure within a range of 30-50 millitorr and includes at least $CHF_3$, $O_2$ and CO as etch gases.

13. The method as in claim 1, wherein said etch resistant material prevents said polysilicon from being attacked during said plasma etching.

14. A method for forming a semiconductor device comprising:
    providing a substrate with designated high voltage (HV) and low voltage (LV) areas;
    forming a plurality of gate oxides including at least one thick gate oxide in said HV area and at least one thin gate oxide in said LV area, each thick gate oxide being thicker than each thin gate oxide;
    forming a pattern of poly features in each of said high voltage and low voltage areas, said poly features including polysilicon covered by a hardmask;
    plasma etching to remove said at least one thick gate oxide from said HV area that is not masked by a hardmask; and
    wet etching to remove said at least one thin gate oxide from said LV area not masked by one of said poly features.

15. The method as in claim 14, further comprising forming a photoresist pattern at least over said LV area prior to said plasma etching and forming a further photoresist pattern over said HV area prior to said wet etching.

16. A method for forming a semiconductor device comprising:
    providing a substrate with designated high voltage (HV) and low voltage (LV) areas;

forming a plurality of gate oxides including at least one thick gate oxide in said HV area and at least one thin gate oxide in said LV area, each thick gate oxide being thicker than each thin gate oxide;

forming masking patterns over said plurality of gate oxides, said masking patterns including patterned photoresist sections and poly features including polysilicon covered by a hardmask;

plasma etching using a selective oxide etch that removes portions of said plurality of gate oxides not covered by said masking patterns;

removing said patterned photoresist sections; and wet etching to remove portions of said at least one thin gate oxide from areas not masked by one of said poly features.

17. The method as in claim 16, in which said patterned photoresist sections are formed over said LV area and further comprising, after said removing said patterned photoresist sections, forming photoresist at least over said HV area and performing said wet etching with said photoresist at least over said HV area.

18. The method as in claim 17, in which said forming masking patterns includes forming said poly features over said at least one thick gate oxide in said HV area and forming said poly features over said at least one thin gate oxide in said LV area and wherein said patterned photoresist sections are formed over said poly features formed over said at least one thin gate oxide in said LV area.

19. The method as in claim 16, wherein said at least one thin gate oxide comprises a first thin gate oxide and a second thin gate oxide, said forming masking patterns includes said poly features formed over said first thin gate oxide, over said second thin gate oxide and over a thick gate oxide of said at least one thick gate oxide;

further comprising forming a first transistor over said first thin gate oxide, forming a second transistor over said second thin gate oxide and forming a third transistor over said thick gate oxide; and operating said first transistor at an operating voltage of 1.8-2.5 volts, operating said second transistor at an operating voltage of about 4-6 volts, and operating said third transistor at an operating voltage greater than 30 volts.

20. The method as in claim 19, wherein said first thin gate oxide includes a thickness less than 40 angstroms, said second thin gate oxide includes a thickness within a range of 100-200 angstroms and said thick gate oxide includes a thickness greater than 300 angstroms.

* * * * *